United States Patent
Saito (10) Patent No.: US 11,586,116 B2
(45) Date of Patent: Feb. 21, 2023

(54) MEASUREMENT APPARATUS, EXPOSURE APPARATUS, AND ARTICLE MANUFACTURING METHOD

(71) Applicant: CANON KABUSHIKI KAISHA, Tokyo (JP)

(72) Inventor: Yuki Saito, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/549,203

(22) Filed: Dec. 13, 2021

(65) Prior Publication Data

US 2022/0197156 A1 Jun. 23, 2022

(30) Foreign Application Priority Data

Dec. 18, 2020 (JP) .............................. JP2020-210589

(51) Int. Cl.
*G03F 7/20* (2006.01)
*G01B 11/25* (2006.01)

(52) U.S. Cl.
CPC .......... *G03F 7/70775* (2013.01); *G01B 11/25* (2013.01)

(58) Field of Classification Search
CPC ............................ G03F 7/70775; G01B 11/25
See application file for complete search history.

(56) References Cited

U.S. PATENT DOCUMENTS

| 7,245,349 B2 * | 7/2007 | Sato ...................... G03F 9/7088 355/75 |
| 8,571,300 B2 * | 10/2013 | Arnison .............. G03F 7/70641 382/255 |
| 10,754,255 B2 * | 8/2020 | Miyaharu ............. G03F 9/7088 |
| 2020/0117084 A1 * | 4/2020 | Sato ....................... G03F 9/7042 |

FOREIGN PATENT DOCUMENTS

| JP | H0921620 A | 1/1997 |
| JP | 5443303 B2 | 3/2014 |
| JP | 2018179665 A | 11/2018 |
| JP | 6491833 B2 | 3/2019 |

* cited by examiner

*Primary Examiner* — Hung V Nguyen (74) *Attorney, Agent, or Firm* — Rossi, Kimms & McDowell LLP (57) ABSTRACT

A measurement apparatus for measuring a height position of an object is provided. The apparatus comprises a light projector that projects measurement light onto the object, a light receiver that receives the measurement light reflected by the object, and a processor that determines a height position of the object based on an image of the measurement light received by the light receiver. The light projector projects a coarse detection pattern and a fine detection pattern having a periodic pattern onto the object, and the processor determines a coarse detection value of a height position of the object based on the coarse detection pattern received by the light receiver, and determines a fine detection value of a height position of the object based on the coarse detection value and the fine detection pattern received by the light receiver.

10 Claims, 9 Drawing Sheets

LIGHT PROJECTION PATTERN

FIG. 4B
PRIOR ART

LIGHT-RECEIVING PATTERN IMAGE OF LIGHT PROJECTION PATTERN OF FIG.4A

FIG. 4C
PRIOR ART

PITCH- DEVIATED LIGHT PROJECTION PATTERN

FIG. 4D
PRIOR ART

LIGHT-RECEIVING PATTERN IMAGE OF LIGHT PROJECTION PATTERN OF FIG.4C (SAME IMAGE AS FIG.4B)

MEASUREMENT APPARATUS, EXPOSURE APPARATUS, AND ARTICLE MANUFACTURING METHOD

BACKGROUND OF THE INVENTION

Field of the Invention

The present invention relates to a measurement apparatus, an exposure apparatus, and an article manufacturing method.

Description of the Related Art

Microdevices such as semiconductor devices and liquid crystal display devices are manufactured by a method of photolithography in which a pattern formed on an original is transferred to a substrate. An exposure apparatus used in a photolithography process has an original stage for supporting an original and a substrate stage for supporting the substrate, and transfers a pattern of the original to the substrate through a projection optical system while sequentially moving the original stage and the substrate stage. In the exposure apparatus, every time a respective exposure target region (shot region) on the substrate is moved to the exposure position under a projection optical system by the substrate stage, a deviation between the focal point of the projection optical system and the plane position (height position) of the substrate is detected by the measurement apparatus, and the plane position of the substrate is corrected and focused.

Japanese Patent No. 6491833 discloses performing a measurement of a height of a substrate which is a target object by using measurement slits whose length, interval, and width are made to change in a stepwise fashion. Japanese Patent Laid-Open No. 2018-179665 discloses obtaining the phase of a fringe pattern using a fixed pattern by simultaneously projecting the fringe pattern and the fixed pattern. Japanese Patent No. 5443303 describes, performing a small number of high-precision height measurements by measuring the phase relationship between a long-period pattern and a short-period pattern in advance.

However, because a pattern in a region of a detection target is made to change according to the technique of Japanese Patent No. 6491833, it may be disadvantageous in terms of measurement accuracy. According to the technique of Japanese Patent Laid-Open No. 2018-179665, since it is necessary to match the projection position of a fringe pattern and the projection position of a fixed pattern, the measurement point density may be diminished in proportion to the fixed pattern. Further, according to the technique of Japanese Patent No. 5443303, since the step of projecting while changing the phase of the periodic pattern is required to be performed at least four times, it can be disadvantageous in terms of measurement time, that is throughput.

SUMMARY OF THE INVENTION

The present invention provides, for example, a measurement apparatus which is advantageous for achieving both high precision measurement and high throughput.

The present invention in its one aspect provides a measurement apparatus for measuring a height position of an object, the apparatus comprising a light projector configured to project measurement light onto the object, a light receiver configured to receive the measurement light reflected by the object, and a processor configured to determine a height position of the object based on an image of the measurement light received by the light receiver, wherein the light projector is configured to project a coarse detection pattern and a fine detection pattern having a periodic pattern onto the object, and the processor is configured to determine a coarse detection value of a height position of the object based on the coarse detection pattern received by the light receiver, and determine a fine detection value of a height position of the object based on the coarse detection value and the fine detection pattern received by the light receiver.

Further features of the present invention will become apparent from the following description of exemplary embodiments (with reference to the attached drawings).

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

Figure 1:
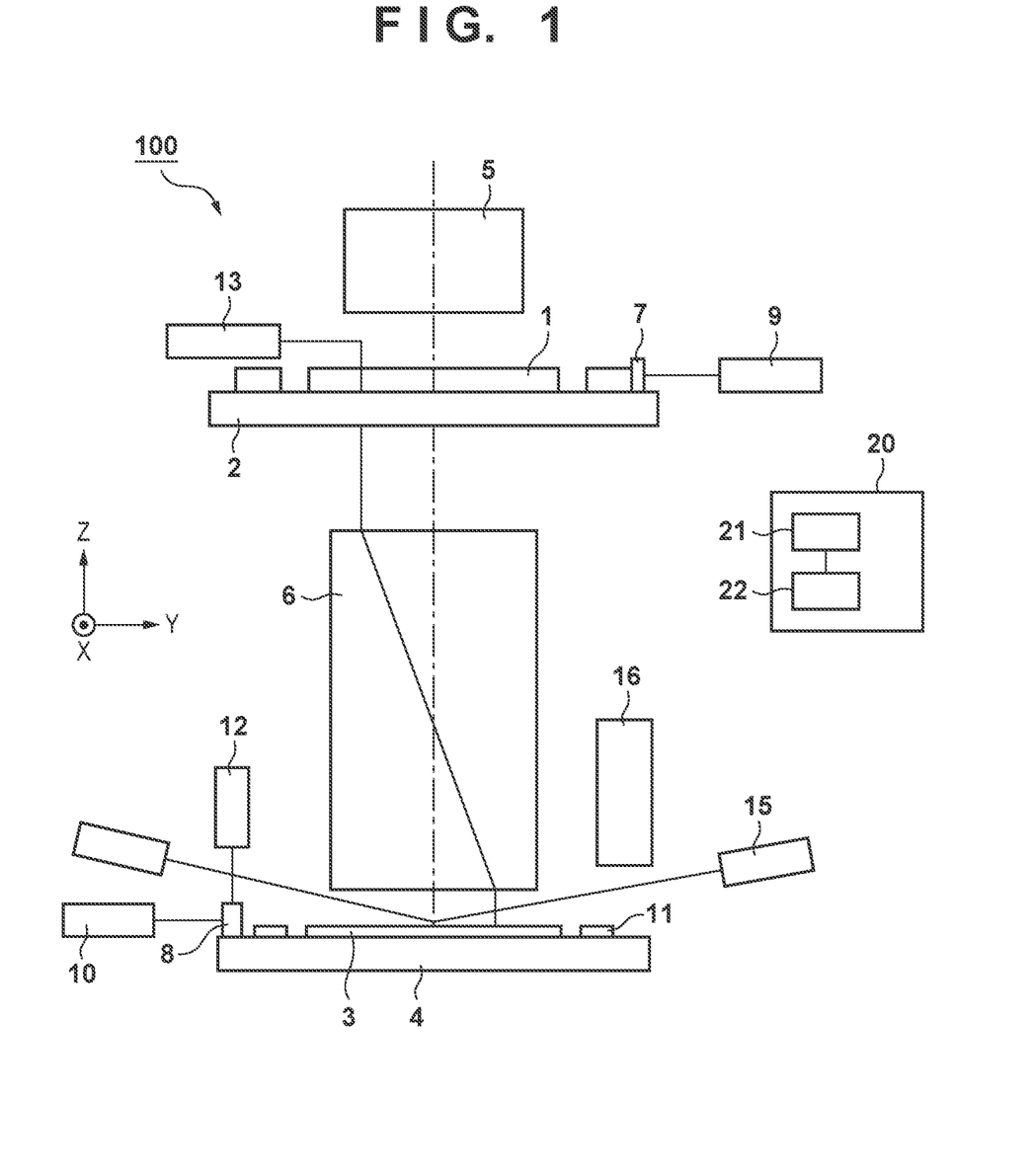
FIG. 1 is a diagram illustrating a configuration of an exposure apparatus.
Figure 2:
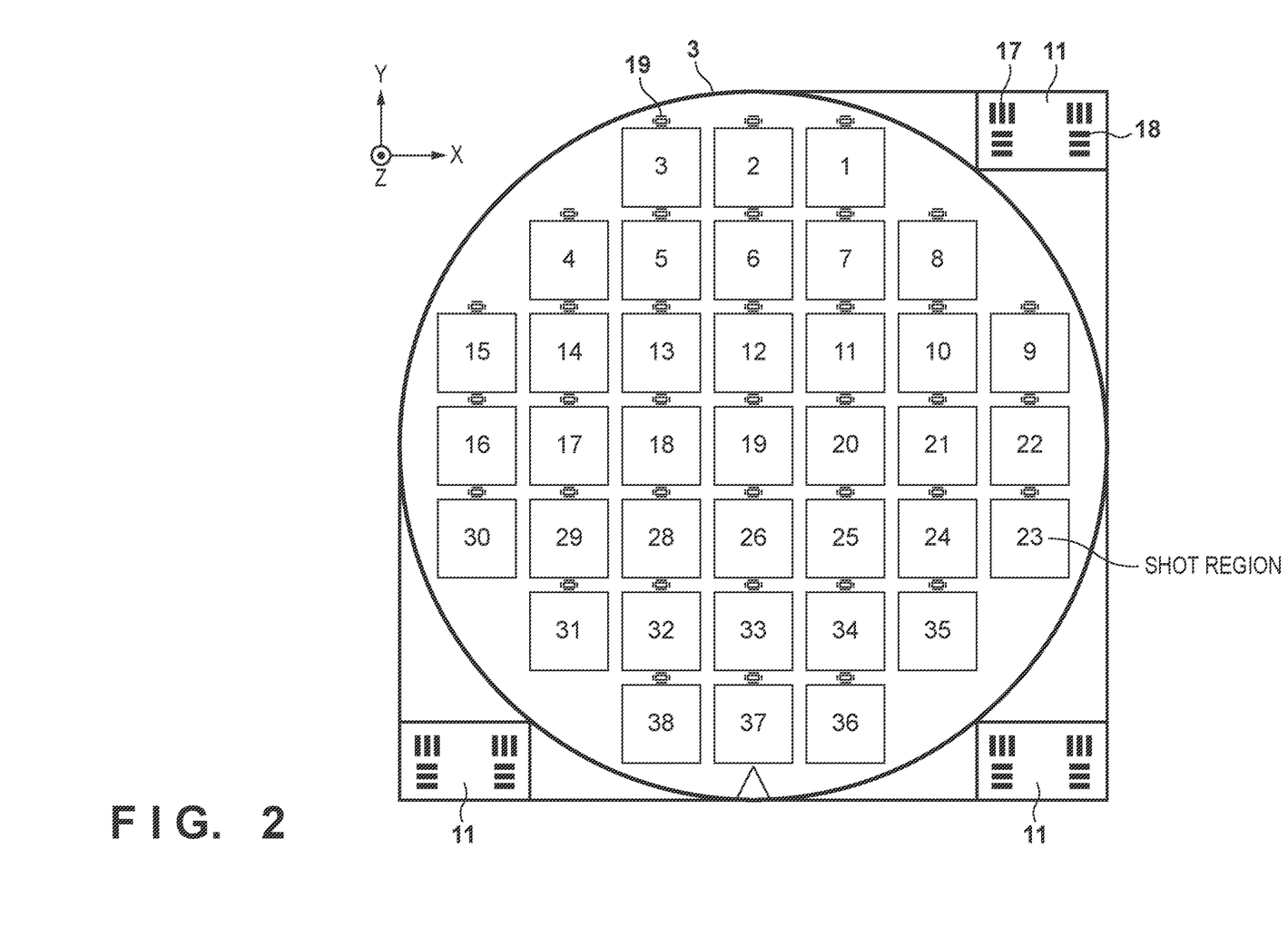
FIG. 2 is a diagram illustrating a shot layout and alignment marks of a substrate.

FIG. 1 is a diagram illustrating a configuration of an exposure apparatus 100 according to an embodiment to which a measurement apparatus of the present invention is applied. FIG. 2 is a diagram illustrating a shot layout and alignment marks of a substrate 3. In this specification and the drawings, directions are illustrated in an XYZ coordinate system in which a horizontal plane is the XY plane. Generally, the substrate 3 is placed on a substrate stage 4 so that its surface is parallel to the horizontal plane (XY plane). Therefore, in the following description, directions orthogonal to each other in a plane along the surface of the substrate 3 are defined as the X axis and the Y axis, and directions perpendicular to the X axis and the Y axis are defined as the Z axis. In the following description, directions parallel to the X axis, the Y axis, and the Z axis in the XYZ coordinate system are referred to as the X direction, the Y direction, and the Z direction, and rotational directions around the X axis, the Y axis, and the Z axis are referred to as the θx direction, the θy direction, and the θz direction, respectively.

In FIG. 1, the exposure apparatus 100 includes an original stage 2 that holds the original 1, a substrate stage 4 that holds the substrate 3 and is movable, and an illumination optical system 5 that illuminates the original 1 held in the original stage 2 with exposure light. The exposure apparatus 100 further includes a projection optical system 6 that projects a pattern of the original 1 illuminated by exposure light onto the substrate 3 held by the substrate stage 4 and exposes the pattern, and a controller 20 that collectively controls the operations of the entire exposure apparatus. The controller 20 may include, for example, a CPU 21 and a memory 22. The memory 22 stores various control data, a control program of the exposure apparatus to be executed by the CPU 21, and the like.

The exposure apparatus 100 may be, for example, a scanning exposure apparatus (scanner) that exposes the substrate 3 while moving the original 1 and the substrate 3 in synchronization with each other in the scanning direction (for example, the Y direction). Alternatively, the exposure apparatus 100 may be an exposure apparatus (stepper) of a type in which the substrate 3 is exposed in a state in which the original 1 is fixed and the substrate 3 is moved stepwise to expose the next shot region.

A predetermined illumination area in the original 1 is illuminated with exposure light having a uniform illuminance distribution by the illumination optical system 5. The light source in the illumination optical system 5 can be a mercury lamp, KrF excimer laser, ArF excimer laser, F2 laser, or the like. Alternatively, in order to produce smaller semiconductor elements or the like, the illumination optical system 5 may emit extreme ultraviolet light (Extreme Ultra Violet: EUV light) having a wavelength of several nm to hundred nm.

The original stage 2 is movable in the XY plane, and can be rotated minutely in the θz direction. The original stage 2 is driven by an original stage driving apparatus (not illustrated) such as a linear motor, and the original stage driving apparatus is controlled by the controller 20. A mirror 7 is provided on the original stage 2. Further, XY plane laser interferometer 9 for measuring the position of the mirror 7 is provided at a position facing the mirror 7. The laser interferometer 9 measures the two-dimensional position and rotation angle of the original 1 on the original stage 2 in real time, and outputs the measurement result to the controller 20. The controller 20 controls the original stage driving apparatus based on the measurement result of the laser interferometer 9, and performs positioning of the original stage 2 (i.e., the original 1).

The projection optical system 6 projects a pattern of the original 1 onto the substrate 3 at a predetermined projection magnification, and may include a plurality of optical elements. The projection optical system 6 may be a reduced projection system with a projection magnification of, for example, ¼ or ⅕.

The substrate stage 4 includes a θz tilt stage for holding the substrate 3 via a substrate chuck (not illustrated), an XY stage (not illustrated) for supporting the θz tilt stage, and a base (not illustrated) for supporting the XY stage. The substrate stage 4 is driven by a substrate stage driving apparatus such as a linear motor (not illustrated). The substrate stage driving apparatus is controlled by the controller 20. Further, a mirror 8 which moves with the substrate stage 4 is provided on the substrate stage 4. Further, a laser interferometer 10 for X and Y axis measurement at a position facing the mirror 8, and a laser interferometer 12 for Z direction measurement are provided. The X and Y axis positions and θz of the substrate stage 4 are measured by the laser interferometer 10 in real time, and the measurement result is outputted to the controller 20. Also, the laser interferometer 12 measures the Z axis position, θx, and θy of the substrate stage 4 in real time, and outputs the measurement result to the controller 20. The controller 20 controls the substrate stage driving apparatus based on the measurement result of the laser interferometers 10 and 12, and performs positioning of the substrate stage 4 (i.e., the substrate 3).

An original alignment detection system 13 is provided in the vicinity of the original stage 2. The original alignment detection system 13 detects an original reference mark (not illustrated) of the original 1 and a substrate-side reference mark 17 (see FIG. 2) on a stage reference plate 11 on the substrate stage 4. Also, the original alignment detection system 13 is mounted with a photoelectric conversion element such as a CCD camera, for example, to detect the reflected light from the original reference mark and the substrate-side reference mark 17. Based on the signal of the photoelectric conversion element, alignment between the original and the substrate is performed. At this time, by adjusting the position and focus of the original reference mark and the substrate-side reference mark 17, it is possible to adjust the relative positional relationship (X, Y, Z) between the original and the substrate. Incidentally, the substrate-side reference mark 17 may be transmissive or reflective. The stage reference plate 11 at the corner of the substrate stage 4 is installed at approximately the same height as the surface of the substrate 3.

An off-axis (OA) detection system 16 includes an irradiator for irradiating the measurement light to the substrate alignment mark 19 on the substrate 3 (see FIG. 2) and the OA detection system reference mark 18 on the stage reference plate 11 (see FIG. 2). The OA detection system 16 further internally includes a light receiver for receiving the reflected light from these marks, detects the position of the substrate alignment mark 19 and the OA detection system reference mark 18.

A measurement apparatus 15, which is a focus/tilt detection system, measures a surface position (height position) in a height direction (Z axis) of the substrate 3 by projecting measurement light onto the surface of the substrate 3 which is a target object (object) and receiving measurement light reflected by the substrate 3. Here, the measurement apparatus 15 is configured to be controlled by the controller 20, but the measurement apparatus 15 may be provided with a dedicated controller.

Figure 3A:
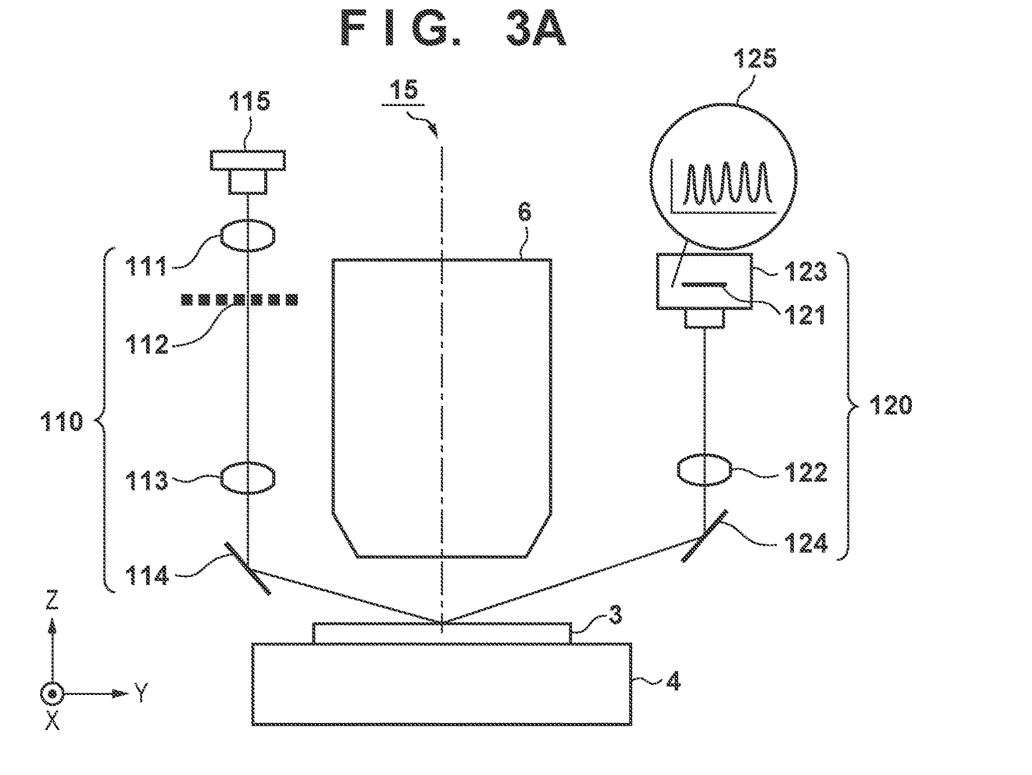
FIGS. 3A and 3B are diagrams illustrating a configuration example of a measurement apparatus and a configuration example of a mask.

Referring to FIG. 3A, the measurement apparatus 15 will be described in detail. The measurement apparatus 15 may include the light projector 110 that projects measurement light to the substrate 3, and a light receiver 120 that receives the measurement light reflected by the substrate 3. A signal of an image of the measurement light received by the light receiver 120 is transferred to the controller 20, which is a processor, and the controller 20 performs a process of determining the height position of the substrate 3 based on the received signal.

The light projector 110 may include a condenser lens 111, a mask 112, a lens 113, and a mirror 114. The light receiver 120 may include a mirror 124, a lens 122, and an image capturing unit 123. The image capturing unit 123 may include an image capturing element 121, such as a CCD or CMOS. Light emitted from a light source 115 is condensed by the condenser lens 111 to illuminate the mask 112. A plurality of slits constituting a pattern are formed in the mask 112, and the measurement light is formed from the light from the light source 115 by the mask 112. Light passing through a plurality of slits of the mask 112, via the lens 113 and the mirror 114, is incident at a predetermined angle of incidence on the substrate 3. The mask 112 and substrate 3 have an imaging relationship with respect to lens 113, and an aerial image of a plurality of slits of the mask 112 is formed on substrate 3. A lens 113 may be used to put the mask 112 and substrate 3 in a shine-proof optical relationship. Thus, the measurement accuracy can be improved by focusing the entire surface of the mask 112 on the substrate 3. When measuring the height of the substrate 3, it is possible to further prevent the measurement value from changing due to local slanting of the substrate 3. Measurement light reflected by the substrate 3, via the mirror 124 and the lens 122, is re-imaged on the image capturing element 121 of the image capturing unit 123, and the signal 125 of the slit image corresponding to a plurality of slits of the mask 112 is obtained. A lens 122 may be used to put the substrate 3 and the image capturing element 121 in a shine-proof optical relationship. Accordingly, the measurement accuracy can be improved by focusing the entire surface of the substrate 3 on the image capturing element 121. When measuring the height of the substrate 3, it is possible to further prevent the measurement value from changing due to local slanting of the substrate 3. The signal 125 is transferred to the controller 20 which is a processor. The controller 20, by detecting the positional deviation of the received signal 125 on the image capturing element 121, obtains the position in the Z direction of the substrate 3 (height position).

Figure 4A:
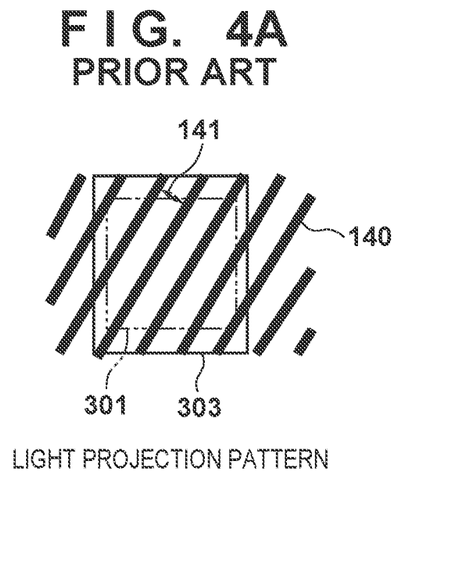
FIGS. 4A to 4D are diagrams for explaining pitch deviation in conventional techniques.
Figure 4B:
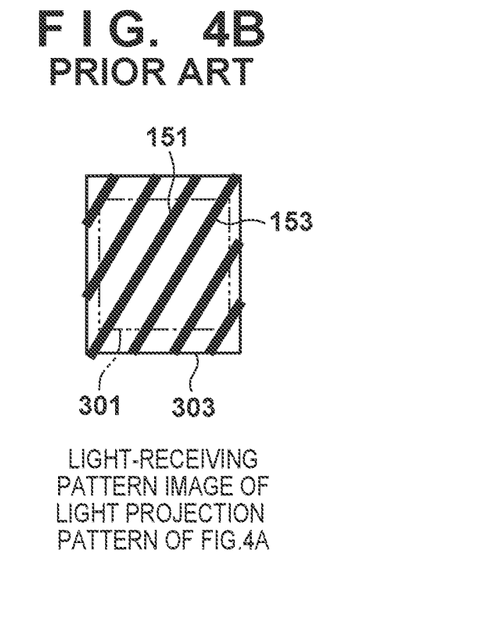

An image of a plurality of slits of the mask 112 is projected onto the substrate 3 by the light projector 110. Hereinafter, this is referred to as a "light projection pattern". Referring to FIGS. 4A to 4D, the light projection pattern 140 on the substrate 3 of conventional techniques will be described. A measurement apparatus, based on a light projection pattern projected onto a predetermined fine detection region 301 in the field of view 303 of the image capturing element, precisely determines the height position. In the measurement apparatus, in order to measure the height in detail in the fine detection region 301 of the surface of the substrate 3, it is necessary to make the pattern interval 141 (FIG. 4A) of the light projection pattern 140 as narrow as possible. When the light projection pattern 140 is received by the light receiver 120, a pattern image 151 appears on the imaging surface of the image capturing element 121 (FIG. 4B). When performing height measurement using each peak position of the signal of the pattern image 151, the number of measurement points increases proportionally to an increase in the number of peak positions 153 in the field of view 303 of the image capturing element. In order to increase the number of measurement points in the fine detection region 301, it is necessary to make the pattern interval 141 narrower.

Figure 4C:
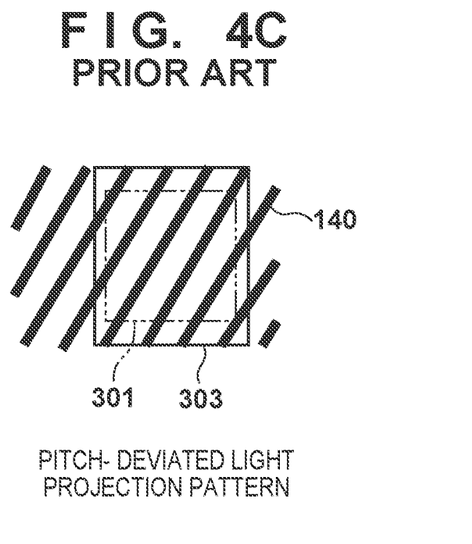
Figure 4D:
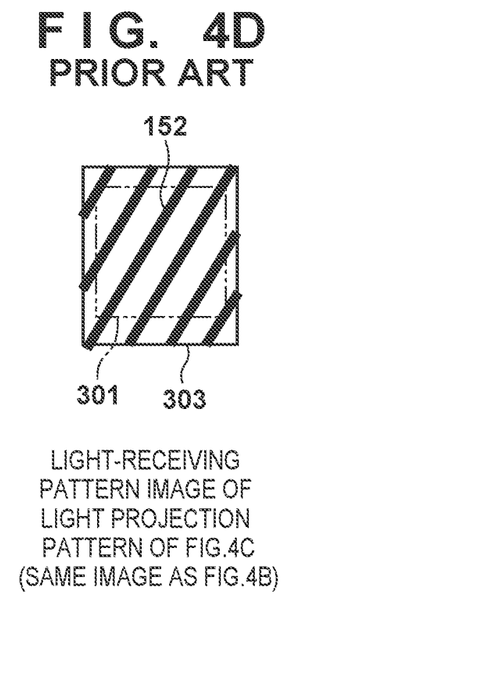

However, when the pattern interval of the light projection pattern 140 is made narrower, the problem of "pitch deviation" may become significant. For example, as illustrated in FIG. 4C, due to variation in the height of the substrate 3, there are cases where the light projection pattern 140 in the fine detection region 301 deviates by one period with respect to the pattern of FIG. 4A. FIG. 4D illustrates a pattern image 151 received by the light receiver 120 at this time, which may be the same as in FIG. 4B. Therefore, even though the height of the substrate 3 varies, the detected value of the height in the fine detection region 301 calculated by the controller 20 may be invariant. Thus, when an error of one period or more occurs in the projection position of the light projection pattern, which has a periodic structure, it is impossible to accurately perform the height measurement.

Figure 3B:
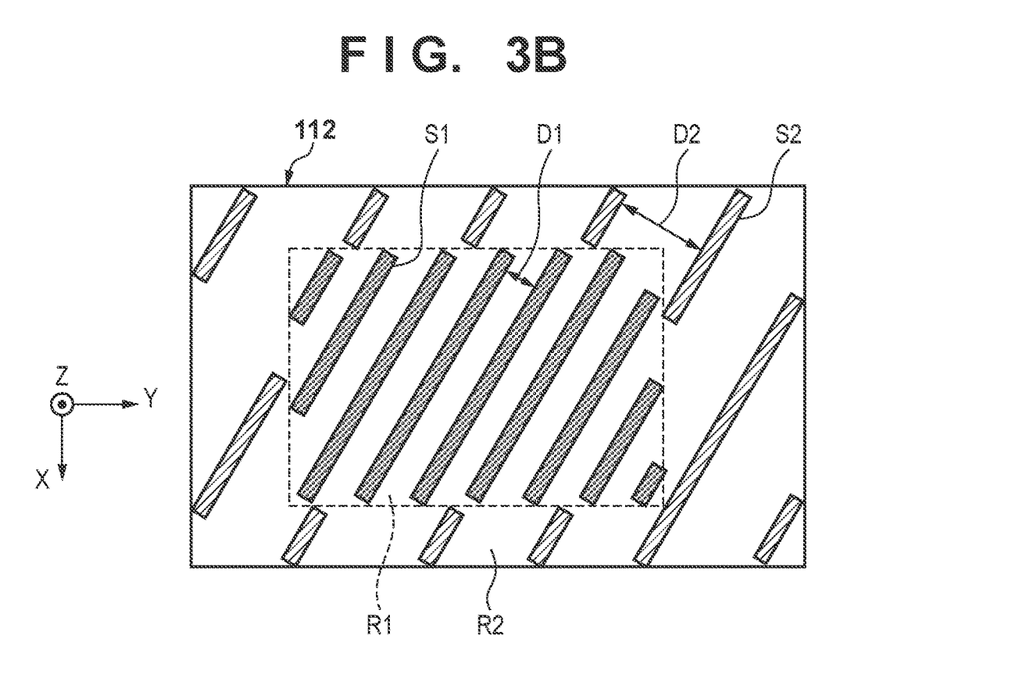

As a countermeasure for such pitch deviation, in the present embodiment, the light projector 110 projects different types of light projection patterns on the substrate 3. A plan view of the mask 112 is illustrated in FIG. 3B. The mask 112 has a first region R1 and a second region R2. For example, the first region R1 is a region in the center of the mask 112, and the second region R2 may be a region adjacent to the first region R1 or a region around the first region R1. In the first region R1, a plurality of slits S1 are periodically arranged at interval D1. When the light from the light source 115 passes through the plurality of slits S1, a fine detection pattern having a periodicity is projected on the substrate 3. In the second region R2, one or more slits are formed. In the example of FIG. 3B, in the second region R2, a plurality of slits S2 are periodically arranged at an interval D2 which is larger than the interval D1. The light from the light source 115 passes through the plurality of slits S2, and thereby a coarse detection pattern is projected onto the substrate 3.

The controller 20, which is a processor, determines the height position of the substrate 3 based on the coarse detection pattern and the fine detection pattern received by the light receiver 123. For example, the controller 20, based on the coarse detection pattern received by the light receiver 123, obtains a coarse detection value of the height position of the substrate 3. The controller 20, after that, based on the obtained coarse detection value and the fine detection pattern received by the light receiver 123, determines a fine detection value of the height position of the substrate 3.

Figure 5:
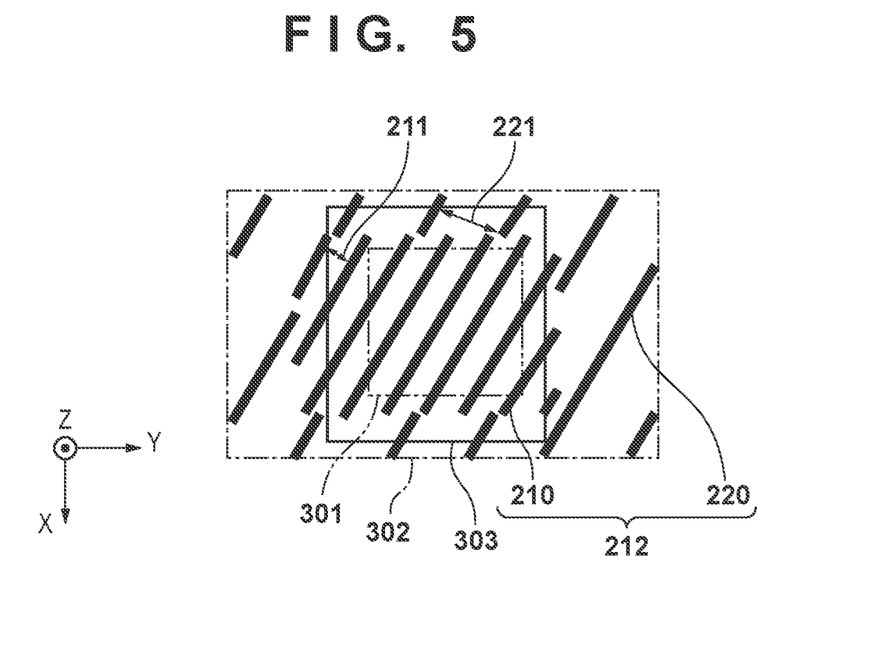
FIG. 5 is a diagram illustrating an example of a light projection pattern on a target object.

FIG. 5 illustrates an example of a light projection pattern projected on the substrate 3 in this embodiment. In FIG. 5, the light projection pattern 212 is composed of a fine detection pattern 210 and a coarse detection pattern 220. The light projector 110 projects both the fine detection pattern 210 and the coarse detection pattern 220 using the mask 112 having the configuration as illustrated in FIG. 3B. The light projector 110 may project the fine detection pattern 210 and the coarse detection pattern 220 at the same time, or may project the fine detection pattern 210 and the coarse detection pattern 220 such that at least a part of a period in which the fine detection pattern 210 is projected and a period in which the coarse detection pattern 220 is projected overlap. The fine detection pattern 210 is projected onto the fine detection region 301, and the coarse detection pattern 220 is projected onto a coarse detection region 302 adjacent to the fine detection region 301. In the field of view 303 of the image capturing element 121, both the fine detection pattern 210 and the coarse detection pattern 220 are incident. In the field of view 303 of the image capturing element 121, the fine detection pattern 210 and the coarse detection pattern 220 may be incident at the same time, and at least a portion of the period in which the fine detection pattern 220 is incident and the period in which the coarse detection pattern 210 is incident may overlap. Incidentally, the light projection pattern 212 varies, depending on the height of the substrate 3, in a direction (Y direction in a plan view viewing from above in the Z direction) in which the pattern is projected from the light projector 110 onto the substrate 3, but it is not necessary for the entire varying light projection pattern 212 to fit into the field of view 303 of the image capturing element 121. It is sufficient that the controller 20 can receive enough pattern light so that it is possible to perform the calculation of the height position in each of the fine detection pattern 210 and the coarse detection pattern 220.

The fine detection pattern 210 and the coarse detection pattern 220 are formed of patterns different from each other. Further, in order to increase the number of measurement points in the fine detection region 301, for example, the interval 211 of the fine detection pattern 210 is made smaller than the interval 221 of the coarse detection pattern 220. The interval 221 of the coarse detection pattern 220 is made to be a length at which the coarse detection pattern 221 does not vary over a single period in the range over which the height of the substrate 3 varies, which is predetermined as a measurement range of the measurement apparatus 100. Therefore, since the coarse detection pattern 220 does not cause pitch deviation (periodic error), the coarse detection value is uniquely determined.

Figure 6:
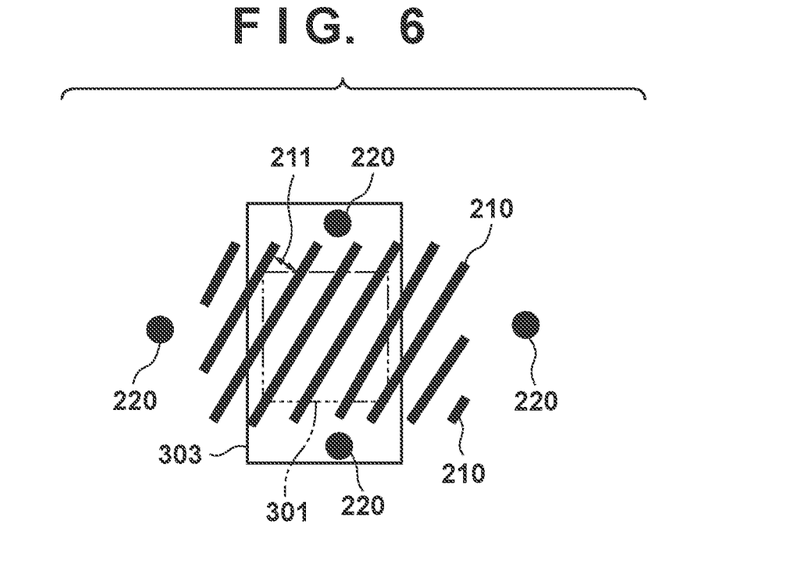
FIG. 6 is a diagram illustrating an example of a light projection pattern on a target object.

The coarse detection pattern 220 may be a single pattern without periodicity as long as it is always possible to perform the height calculation in the controller 20 with respect to the variation of the light projection pattern 112 due to height variation of the substrate 3 within the measurement range of the measurement apparatus 100. As an example, the coarse detection pattern 220 may be a dot pattern as illustrated in FIG. 6. In consideration of changes in the reflectivity of the substrate 3 and the position of the field of view 303 of the image capturing element 121 in the substrate 3 and vignetting or the like due to internal structure, a dot pattern may be arranged at a plurality of locations as the coarse detection pattern 220, as illustrated in FIG. 6.

The fine detection pattern 210 and the coarse detection pattern 220 are adjacent to each other, for example. Because the fine detection pattern 210 and the coarse detection pattern 220 are adjacent, it is possible to reduce the difference in measurement position between the measurement of the height of the substrate 3 using the fine detection pattern 220 and the measurement of the height of the substrate 3 using the coarse detection pattern 210.

Figure 7:
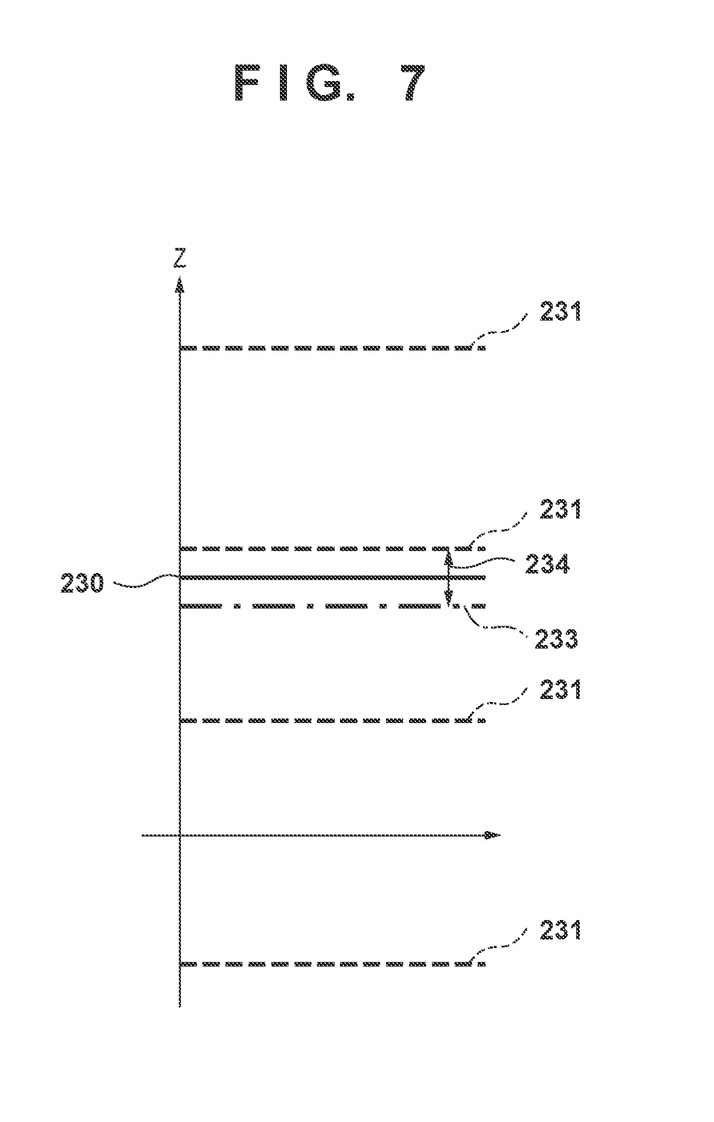
FIG. 7 is a diagram illustrating a method for calculating a height position by the measurement apparatus.

Referring to FIG. 7, a description will be given of a height position calculation method executed by the controller 20. The controller 20, using the coarse detection pattern 220 in the coarse detection region 302, obtains a coarse detection value 233 of the height position of the substrate 3. As described above, since the coarse detection pattern 220 is made to be a pattern that does not cause pitch deviation (periodic error), the coarse detection value 233 is uniquely determined. Thereafter, the controller 20 obtains a fine detection value for the height position of the substrate 3 based on the coarse detection value 233 and the fine detection pattern 210. Specifically, the fine detection value is obtained as follows.

The controller 20, using the fine detection pattern 210 in the fine detection region 301, determines a plurality of height position candidates 231 for the substrate 3 within the measurement range. The plurality of height position candidates 231 may include a height position that is detected without pitch deviation and a height position that is detected with a pitch deviation of one period or more. Since the measurement positions of the fine detection pattern (the fine detection region 301) and the coarse detection pattern measurement position (the coarse detection region 302) are adjacent, the coarse detection value 233 is a value close to the actual height position 230 of the substrate 3 in the fine detection region 301. Therefore, the controller 20 obtains the fine detection value with the smallest difference 234 (closest to the coarse detection value 233) between the coarse detection value 233 of the plurality of height position candidates 231 as the fine detection value.

Thus, it is possible to prevent false detection due to pitch deviation, and high-precision height position detection is realized. This measurement technique is also advantageous in terms of throughput, since it is not necessary to perform multiple projections in order to determine the height position as in the conventional techniques.

Second Embodiment

Figure 8:
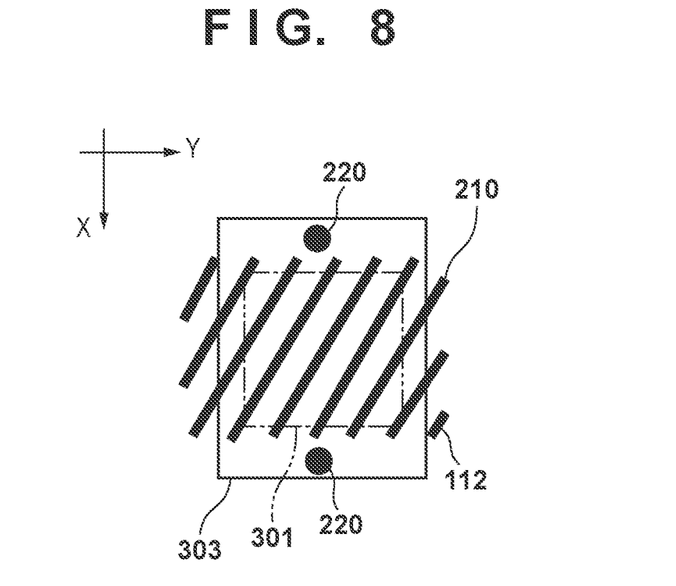
FIG. 8 is a diagram illustrating an example of a light projection pattern on a target object.

FIG. 8 illustrates an example of a light projection pattern on a target object in the second embodiment. When the height of the substrate 3, which is a target object, varies, the position on the substrate 3 at which the light projection pattern 112 is projected changes. At this time, it is impossible to perform measurement if the light projection pattern 112 deviates from the fine detection region 301. Therefore, in the present embodiment, the fine detection pattern 210 is projected onto a region of the surface of the substrate 3 that is larger than the fine detection region 301 including the fine detection region 301 so that the fine detection pattern 210 can be certainly observed in the fine detection region 301 even if the height of the object varies.

In one example, the optical axis direction of the measurement light between the light projector 110 and the light receiver 120 in a plan view viewing the fine detection region 301 in the Z direction from above is parallel to the Y direction. In this case, when the height of the fine detection region 301 fluctuates, the position where the fine detection pattern 210 is projected on the fine detection region 301 changes in the Y direction. Therefore, in order to always project the fine detection pattern 210 onto the fine detection region 301, the projection range in the Y direction of the fine detection pattern 210 is made to be larger than the range in the Y direction of the fine detection region 301.

In this case, for example, as illustrated in FIG. 8, the coarse detection pattern 220 is disposed at a position separated in the X direction 11 with the fine detection pattern 210 interposed therebetween. To measure the height of the object using the coarse detection pattern 220, it is necessary to always receive the coarse detection pattern 220 by the image capturing element 121 regardless of the height variation of the fine detection region 301. If the height of the object varies, the light projection pattern 112 varies in the Y direction which is the optical axis direction of the measurement light in the plan view. Therefore, by arranging the coarse detection pattern 220 along the X direction perpendicular to the Y direction, which is the direction in which the pattern varies due to variations in the height of the object, it is possible to reduce the required size of the image capturing element 121. Generally, since the size and price of the image capturing element are directly proportional, it is desirable that the size of the image capturing element be smaller. Further, since transfer speed and calculation processing speed increase when the number of pixels of the image capturing element increase, and a larger image capturing element is disadvantageous in terms of measurement throughput, and so a smaller image capturing element is desirable.

Third Embodiment

Figure 9:
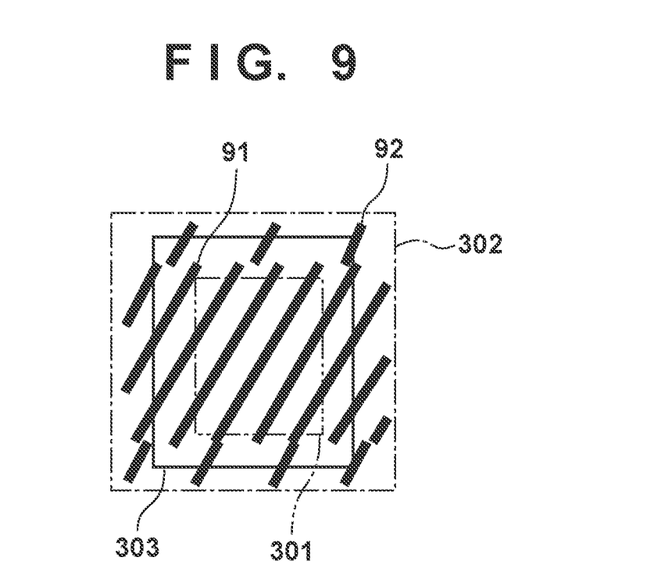
FIG. 9 is a diagram illustrating an example of a light projection pattern on a target object.

FIG. 9 illustrates an example of a coarse detection pattern 92 which is projected to the fine detection region 301 and a fine detection pattern 91 which is projected to the coarse detection region 302 in the vicinity of the fine detection region 301. The fine detection pattern 91 is a pattern having a first period, and the coarse detection pattern 92 is a pattern having a second period longer than the first period. Compared with the example of FIG. 5, the period of the coarse detection pattern 92 in FIG. 9 is shorter than that of the coarse detection pattern 220 of FIG. 5. Since it is possible to increase the number of measurement points the shorter the periodic pattern of the coarse detection pattern 92 is, it is possible to perform height measurement with higher accuracy. By increasing the accuracy of the height measurement of the coarse detection region 302 determined by using the coarse detection pattern 92, it is possible to determine the height position of the fine detection region 301 more accurately from a plurality of height position candidates 231 selected using the fine detection pattern 91.

However, while the period of the coarse detection pattern 220 in the example of FIG. 5 was set to a length that does not cause a pitch deviation, the period of the coarse detection pattern 92 of FIG. 9 is shorter than that, and there is a possibility of pitch deviation as with the fine detection pattern 91. Therefore, in the present embodiment, the height position is obtained as follows.

Figure 10:
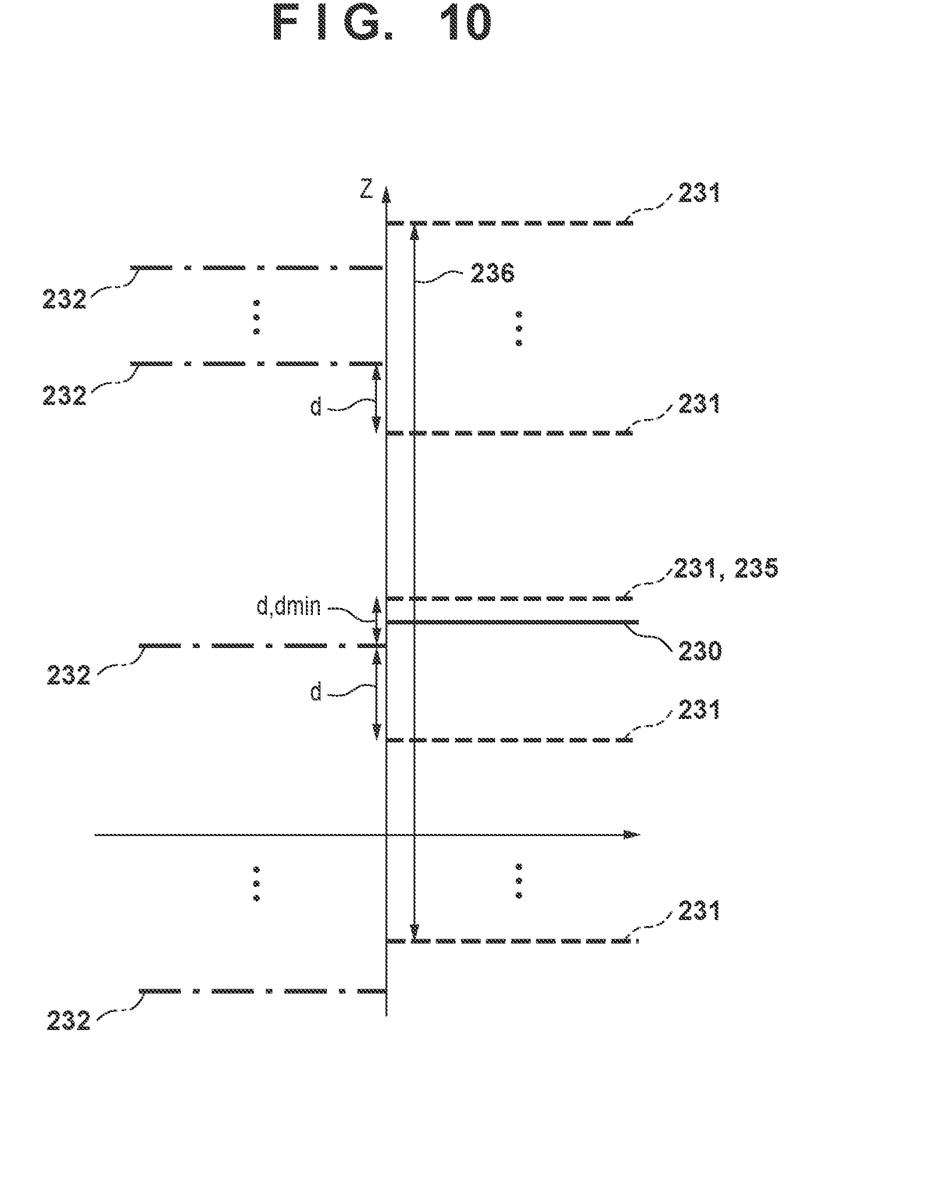
FIG. 10 is a diagram illustrating a method for calculating a height position by the measurement apparatus.

Referring to FIG. 10, a method of calculating the height position in the present embodiment will be described. The controller 20, using the coarse detection pattern 92 in the coarse detection region 302, obtains a coarse detection value of the height position of the substrate 3. However, in the present embodiment, since the coarse detection pattern 92 may cause pitch deviation, the height position is not uniquely determined. Therefore, the controller 20, using the coarse detection pattern 92, obtains a plurality of coarse detection value candidates 232 with respect to the height position of the substrate 3 in the measurement range. The plurality of coarse detection value candidates 232 may include a coarse detection value that is detected without pitch deviation and a coarse detection value that is detected with a pitch deviation of one period or more. Next, the controller 20, using the fine detection pattern 91, obtains a plurality of fine detection value candidates 231 with respect to the height position of the substrate 3 in the measurement range.

Next, the controller 20 specifies the fine detection value candidate 235 of the pair having a difference dmin, the smallest difference d in height position, from among the plurality of pairs each comprising one of the plurality of coarse detection value candidates 232 and one the plurality of fine detection value candidates. The identified fine detection value candidate 235 is closest to the actual height position 230. Therefore, the controller 20 obtains the specified fine detection value candidate 235 as the fine detection value.

Considering the combinations of the plurality of coarse detection value candidates 232 and the plurality of fine detection value candidates 231, the measurement range is a section 236 from a reference state up to where the period of the fine detection pattern 91 and the period of the coarse detection pattern 92 are each exact integer multiples. Thus, while improving the respective measurement accuracy of the fine detection pattern 91 and the coarse detection pattern 92, it is possible to further expand the measurement range by the fine detection pattern 91.

Further, by making both the fine detection pattern 91 and the coarse detection pattern 92 be periodic patterns, it is possible to use the same height calculation method for each of the fine detection pattern 91 and the coarse detection pattern 92. Thus, since it is not necessary to have a plurality of processors (not illustrated) in the controller 20, it is possible to reduce cost by simplifying the processor, it and to improve the processing speed by a single process.

Fourth Embodiment

The exposure apparatus 100 transfers the pattern of the original 1 to each of the plurality of shot regions of the substrate 3 as illustrated in FIG. 2. Referring to the flowchart of FIG. 11, a method of exposing a substrate by the exposure apparatus 100 will be described.

Figure 11:
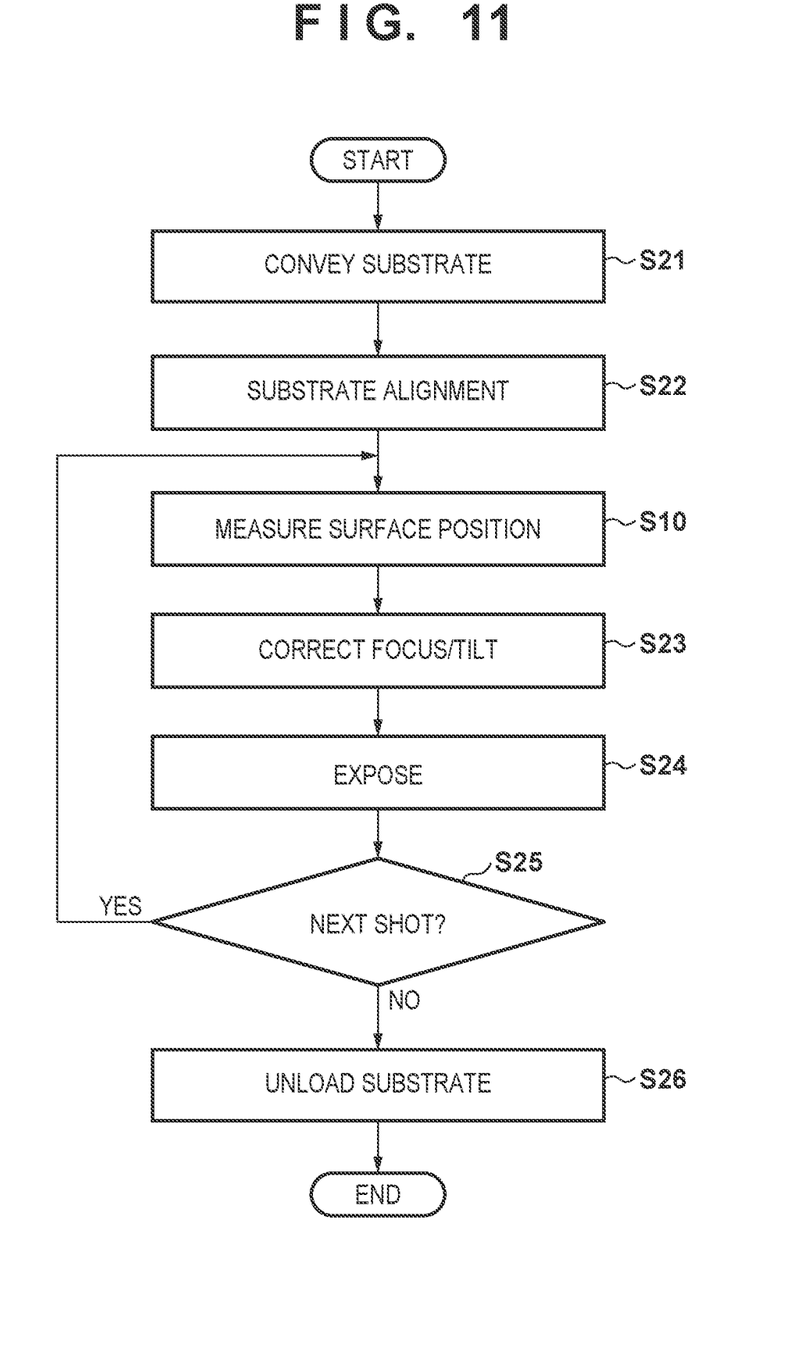
FIG. 11 is a flowchart for describing an exposure method.

First, in step S21, the substrate 3 is conveyed into the exposure apparatus 100, and in step S22, alignment of the substrate 3 is performed by the OA detection system 16. Next, in step S10, the surface position measurement of the substrate 3 according to the method described above is performed by the measurement apparatus 15, and surface shape data which is a measurement result is stored in the memory 22, for example. Next, in step S23, the substrate 3 is positioned at a position for starting the scanning of the shot region to be exposed by the substrate stage 4. At that time, the substrate stage 4, based on the surface shape data of the substrate 3, controls the position (focus) in the Z direction and the inclination (tilt) of the substrate 3 so that the amount of deviation of the surface position of the substrate 3 from the image plane of the projection optical system 6 is reduced. In step S24, a shot region to be exposed is scanned and exposed. In this scanning exposure, the controller 20 causes the substrate stage 4 to control the Z axis position (focus) and inclination (tilt) of the substrate 3 so that the amount of deviation from the image plane is reduced. Thus, in the scanning exposure of each shot region, the surface of the substrate 3 can be matched with the image plane of the projection optical system 6 in synchronization with the scanning of the substrate 3. In step S25, the controller 20 determines whether there is an unexposed shot region. If there is an unexposed shot region, the process returns to step S10 to repeat the process for the next shot region. After the exposure of all the shot regions is completed, in step S26, the substrate 3 is unloaded from the exposure apparatus 100.

By the exposure method above, the exposure apparatus 100 transfers the pattern of the original 1 to each of the plurality of shot regions of the substrate 3 as illustrated in FIG. 2. That is, a common pattern is transferred to each shot region. Therefore, the measurement using the coarse detection pattern may be performed only when measuring the height position of the substrate 3 the first time. Further, when the height variation of the substrate 3 is envisioned in advance, configuration may be taken such that measurement using a coarse detection pattern is not performed. Since the number of measurement points is reduced in that case, the capture speed from the image capturing element and the height calculation speed in the controller are improved. Alternatively, the number of measurement points for height measurement using the fine detection pattern may be increased by the amount that the number of measurement points was reduced. In that case, the high density height measurement can be performed without changing the height calculation speed.

Embodiments of Article Manufacturing Method

The article manufacturing method according to the embodiment of the present invention is suitable for manufacturing an article such as a microdevice such as a semiconductor device or an element having a microstructure, for example. The article manufacturing method of the present embodiment includes a step of forming a latent image pattern on a photosensitive agent applied to a substrate using the above-described exposure apparatus (a first step of exposing the substrate), and a second step of developing the substrate on which the latent image pattern is formed by such a step. In addition, such manufacturing methods include other well-known processes such as oxidation, deposition, evaporation, doping, planarization, etching, resist stripping, dicing, bonding, packaging, and the like. The article manufacturing method of the present embodiment is advantageous in at least one of the performance, quality, productivity, and production cost of an article as compared with a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-210589, filed Dec. 18, 2020, which is hereby incorporated by reference herein in its entirety.

What is claimed is:

1. A measurement apparatus for measuring a height position of an object, the apparatus comprising:
   a light projector configured to project measurement light onto the object;
   a light receiver configured to receive the measurement light reflected by the object; and
   a processor configured to determine a height position of the object based on an image of the measurement light received by the light receiver, wherein
   the light projector is configured to project a coarse detection pattern and a fine detection pattern having a periodic pattern onto the object, and
   the processor is configured to:
   determine a coarse detection value of a height position of the object based on the coarse detection pattern received by the light receiver; and
   determine a fine detection value of a height position of the object based on the coarse detection value and the fine detection pattern received by the light receiver.

2. The measurement apparatus according to claim 1, wherein the processor is configured to:
   determine a plurality of height position candidates based on the fine detection pattern received by the light receiver; and
   determine the closest of the plurality of height position candidates to the coarse detection value as the fine detection value.

3. The measurement apparatus according to claim 1, wherein the processor is configured to:
   determine a plurality of coarse detection value candidates based on the coarse detection pattern;
   determine a plurality of fine detection value candidates based on the fine detection pattern; and
   determine, as the fine detection value, a fine detection value candidate of a pair having a smallest difference in height position from among a plurality of pairs each comprising one of the plurality of coarse detection value candidates and one of the plurality of fine detection value candidates.

4. The measurement apparatus according to claim 1, wherein the light projector is configured to project the fine detection pattern onto a fine detection region which is a region for determining the fine detection value using the fine detection pattern in a surface of the object, and project the coarse detection pattern onto a coarse detection region adjacent to the fine detection region.

5. The measurement apparatus according to claim 1, wherein the light projector is configured to perform projection of the fine detection pattern and projection of the coarse detection pattern so that at least a part of a time interval over which the fine detection pattern is projected and a time interval over which the coarse detection pattern is projected overlap.

6. The measurement apparatus according to claim 4, wherein the fine detection pattern is projected onto a region that is larger than the fine detection region and that encompasses the fine detection region in the surface of the object.

7. The measurement apparatus according to claim 1, wherein the coarse detection pattern is a non-periodic pattern.

8. The measurement apparatus according to claim 1, wherein the fine detection pattern is a periodic pattern that has a first period, and the coarse detection pattern is a periodic pattern that has a second period which is longer than the first period.

9. An exposure apparatus for projecting a pattern of an original onto a substrate by a projection optical system and exposing the substrate, the apparatus comprising:
   the measurement apparatus according to claim 1 arranged so as to measure a height position of the substrate; and
   a controller configured to, based on a result measured by the measurement apparatus, control a position of the substrate so that an amount of deviation of the height position from an image plane of the projection optical system is reduced.

10. A method for manufacturing an article, the method comprising:
   exposing a substrate using the exposure apparatus according to claim 9; and
   developing the exposed substrate, wherein
   the article is manufactured from the developed substrate.

* * * * *